(12) United States Patent
Rieger et al.

(10) Patent No.: US 7,531,439 B2
(45) Date of Patent: May 12, 2009

(54) METHOD FOR FORMING AN INTEGRATED SEMICONDUCTOR CIRCUIT ARRANGEMENT

(75) Inventors: Johann Rieger, Bad Abbach (DE); Stefan Lipp, Neumarkt (DE); Hans Peter Zeindl, Altdorf (DE); Thomas Detzel, Villach (AT); Hubert Maier, Villach (AT)

(73) Assignee: Infineon Technologies AG, Munich (DE)

( * ) Notice: Subject to any disclaimer, the term of this patent is extended or adjusted under 35 U.S.C. 154(b) by 266 days.

(21) Appl. No.: 11/138,984

(22) Filed: May 26, 2005

(65) Prior Publication Data
US 2006/0014371 A1 Jan. 19, 2006

(30) Foreign Application Priority Data
May 28, 2004 (DE) .................. 10 2004 026 232

(51) Int. Cl.
*H01L 21/44* (2006.01)

(52) U.S. Cl. .............. 438/598; 438/618; 438/669; 438/761; 257/E21.575; 257/E21.641

(58) Field of Classification Search ........... 438/584, 438/589, 676, 586–588, 597–599, 602, 605, 438/618–622, 627, 628, 631, 642, FOR. 385, 438/FOR. 388, FOR. 406, 612, 157, 283, 438/270, FOR. 203, FOR. 405, 170, 189, 438/201–205, 211, 234–236, 257, 309, 313, 438/322, 340, 593, 637, 666, 669, 672, 674, 438/761, FOR. 165, FOR. 186; 257/E21.641, 257/E21.627, E21.59, 751, E21.422, E21.575, 257/E21.579, E21.585, E21.687, E21.68, 257/E21.688
See application file for complete search history.

(56) References Cited

U.S. PATENT DOCUMENTS

| | | | | | |
|---|---|---|---|---|---|
| 5,057,897 | A | * | 10/1991 | Nariani et al. | 257/637 |
| 5,284,799 | A | * | 2/1994 | Sato | 438/618 |
| 5,407,862 | A | * | 4/1995 | Miyamoto | 438/653 |
| 5,652,180 | A | * | 7/1997 | Shinriki et al. | 438/620 |
| 5,702,983 | A | * | 12/1997 | Shinohara | 438/628 |
| 5,705,426 | A | * | 1/1998 | Hibino | 438/643 |
| 5,718,800 | A | * | 2/1998 | Juengling | 438/200 |
| 5,745,335 | A | * | 4/1998 | Watt | 361/313 |
| 5,763,954 | A | * | 6/1998 | Hyakutake | 257/774 |
| 5,935,766 | A | * | 8/1999 | Cheek et al. | 430/316 |
| 6,020,640 | A | * | 2/2000 | Efland et al. | 257/751 |
| 6,087,250 | A | * | 7/2000 | Hyakutake | 438/598 |

(Continued)

FOREIGN PATENT DOCUMENTS

JP 02238629 9/1990

(Continued)

*Primary Examiner*—Matthew Smith
*Assistant Examiner*—Quovaunda V. Jefferson
(74) *Attorney, Agent, or Firm*—Dicke, Billig & Czaja, PLLC

(57) ABSTRACT

Methods for forming an integrated semiconductor circuit arrangement are disclosed. In one embodiment, a semiconductor circuit with a first semiconductor circuit region and with a second semiconductor circuit region is formed in each case in a semiconductor material region. A first metallization layer is applied to the structure thus obtained. A protective material region is then formed. A second metallization layer is subsequently applied, which is then also patterned. Afterward, the first metallization layer together with the protective material region is then patterned.

21 Claims, 22 Drawing Sheets

U.S. PATENT DOCUMENTS

| | | | | |
|---|---|---|---|---|
| 6,162,682 A * | 12/2000 | Kleine | | 438/257 |
| 6,376,323 B1 * | 4/2002 | Kim et al. | | 438/373 |
| 6,417,093 B1 * | 7/2002 | Xie et al. | | 438/626 |
| 6,680,516 B1 * | 1/2004 | Blosse et al. | | 257/412 |
| 6,720,243 B2 * | 4/2004 | Weng | | 438/612 |
| 6,790,719 B1 * | 9/2004 | Adetutu et al. | | 438/195 |
| 6,936,508 B2 * | 8/2005 | Visokay et al. | | 438/199 |
| 2002/0175710 A1 * | 11/2002 | Yoo et al. | | 326/95 |
| 2004/0097024 A1 * | 5/2004 | Doi | | 438/151 |

FOREIGN PATENT DOCUMENTS

JP  04010455  1/1992

* cited by examiner

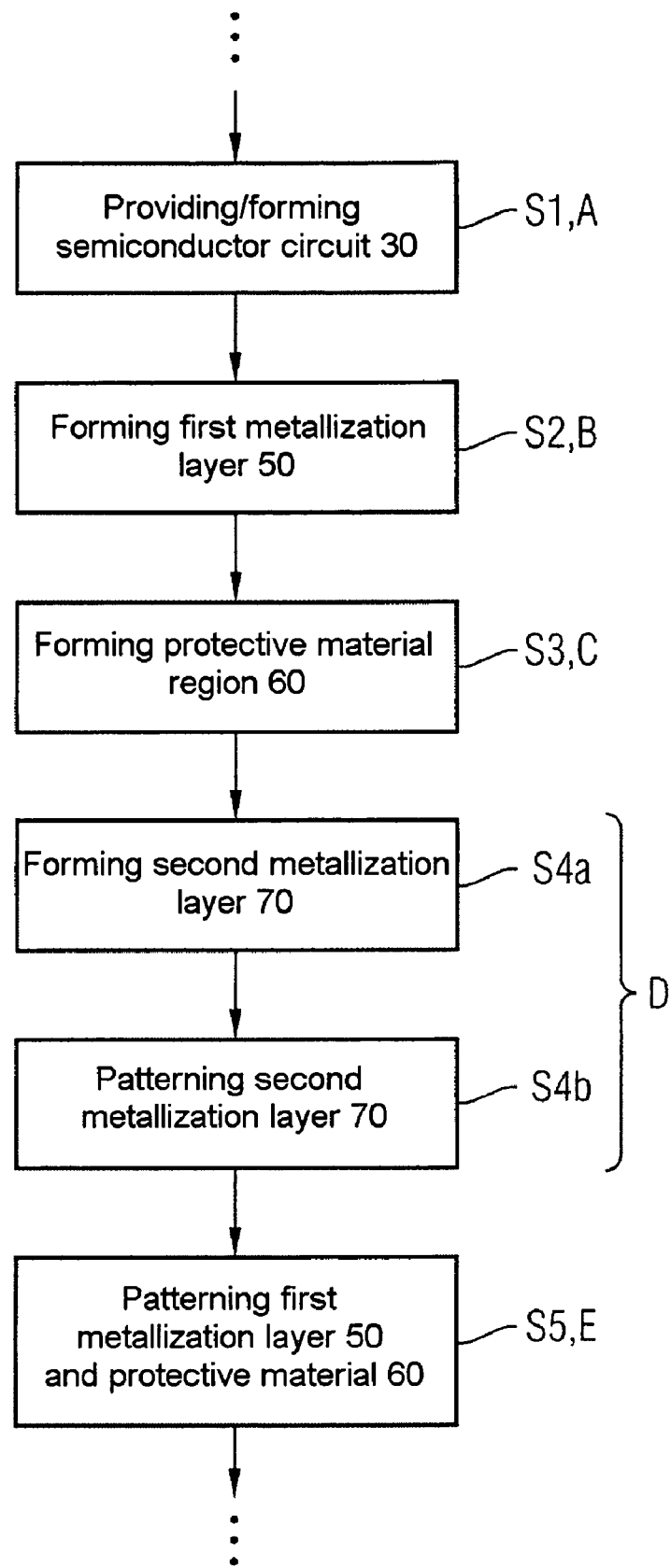

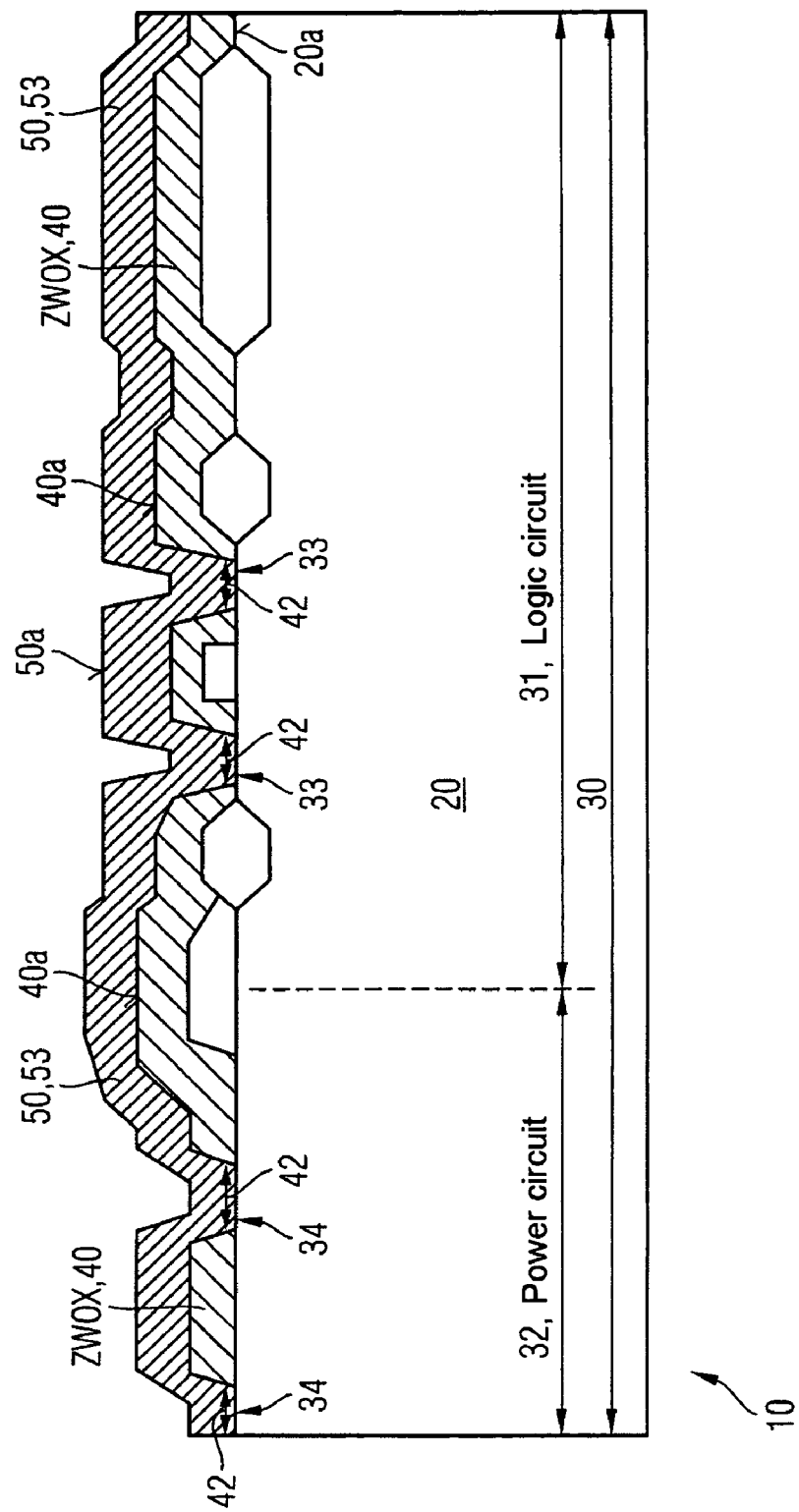

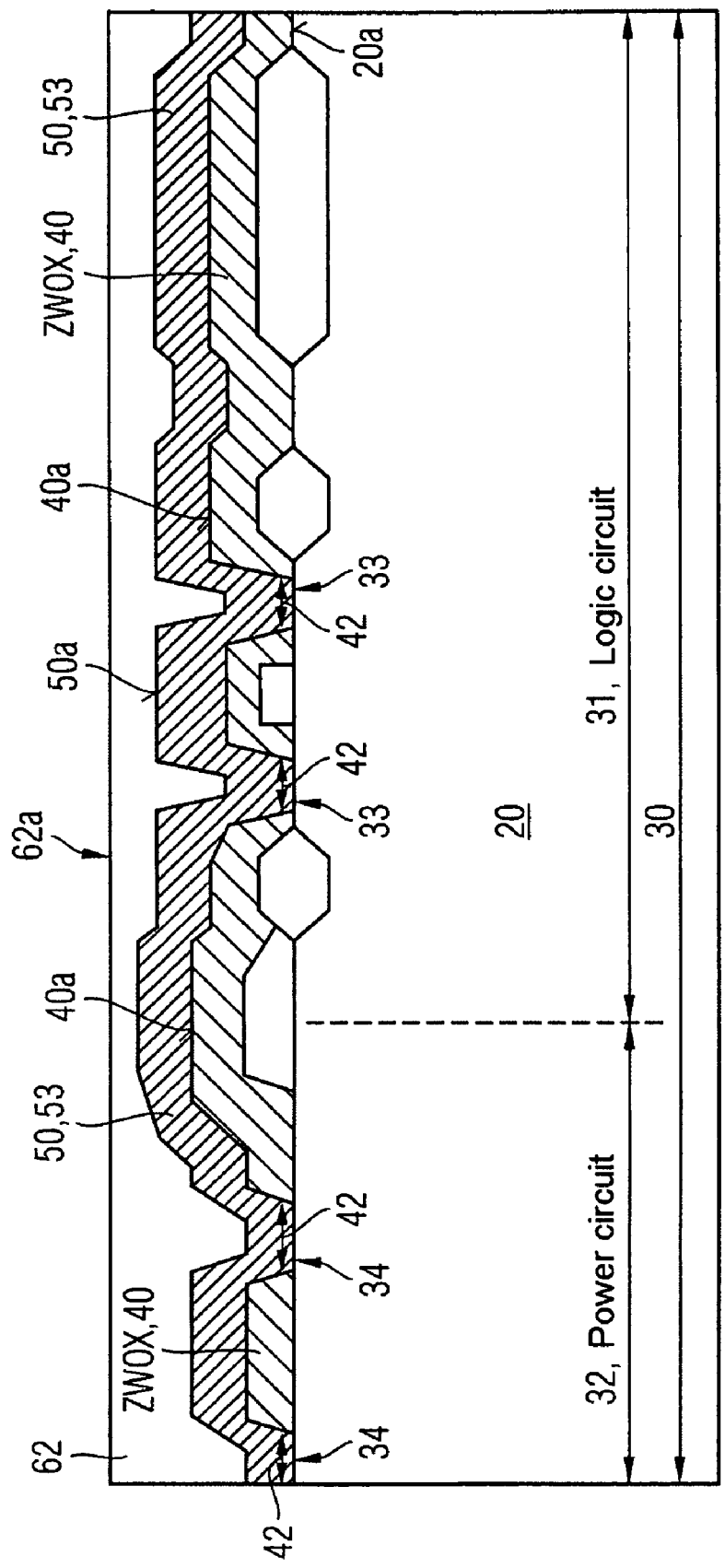

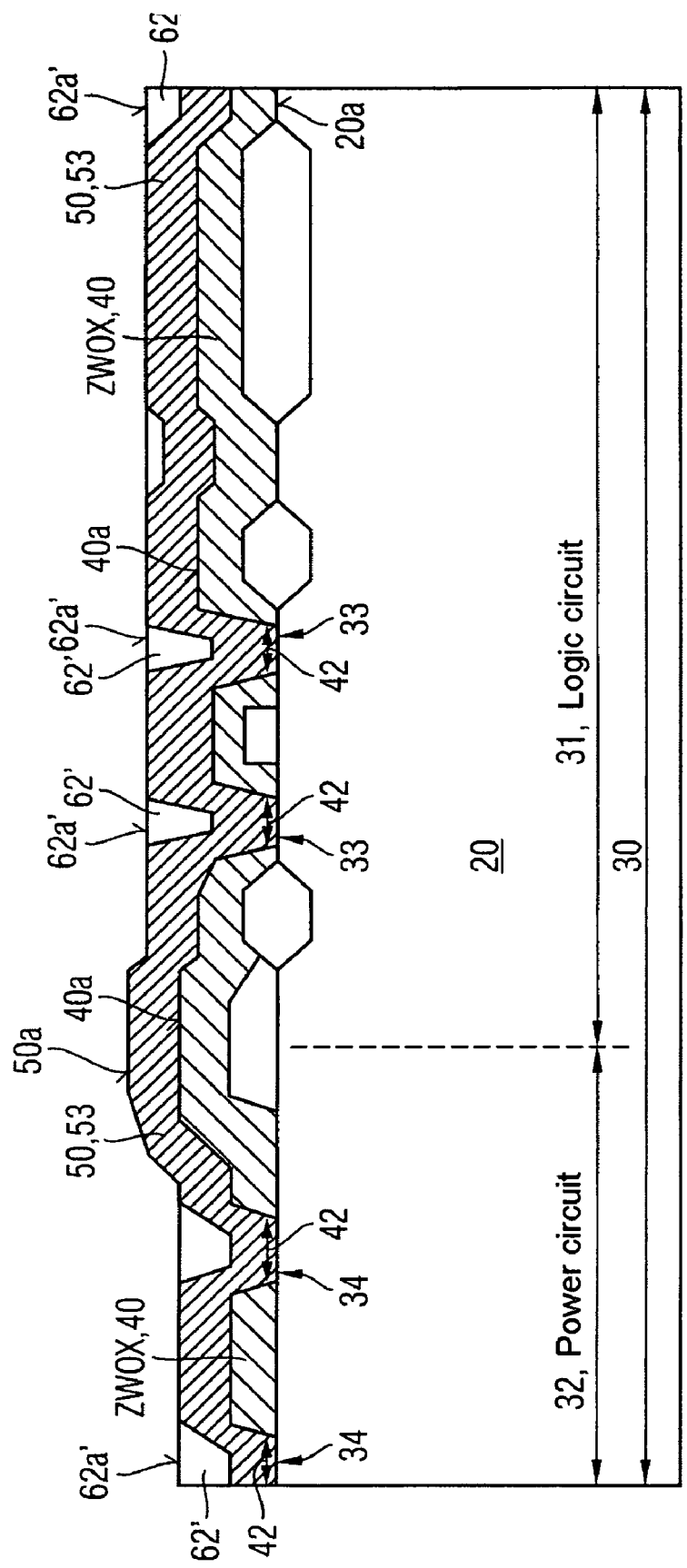

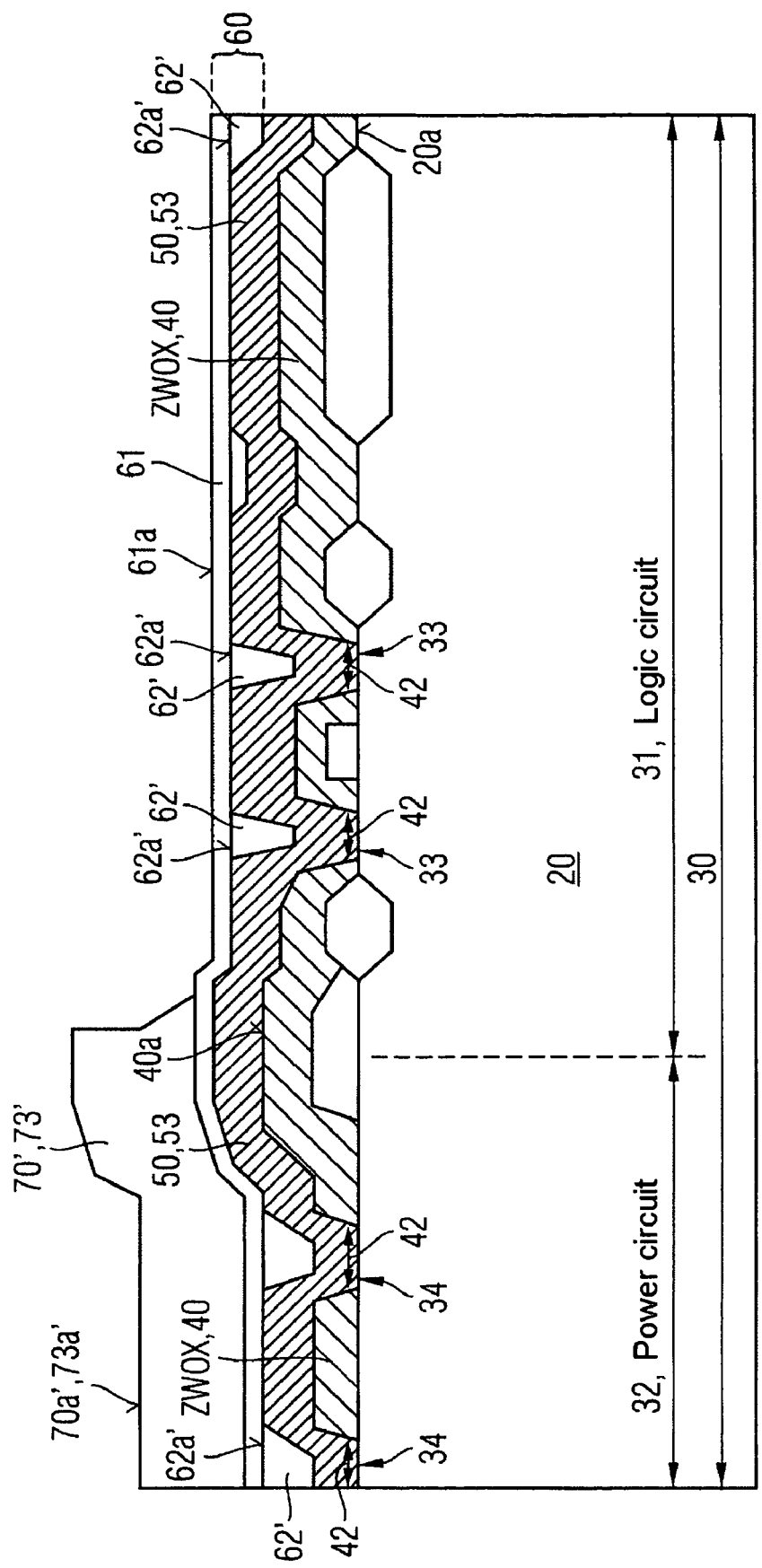

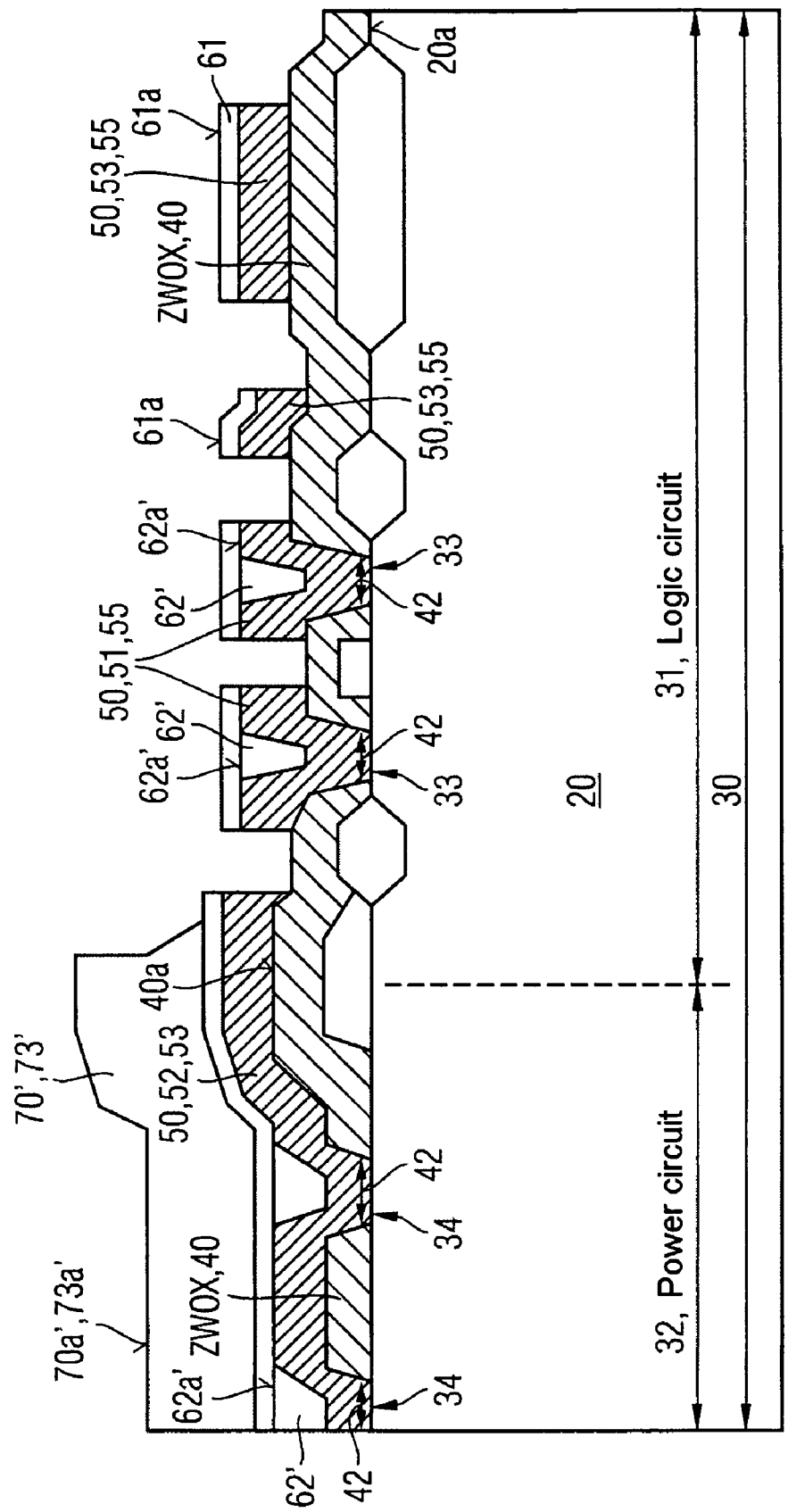

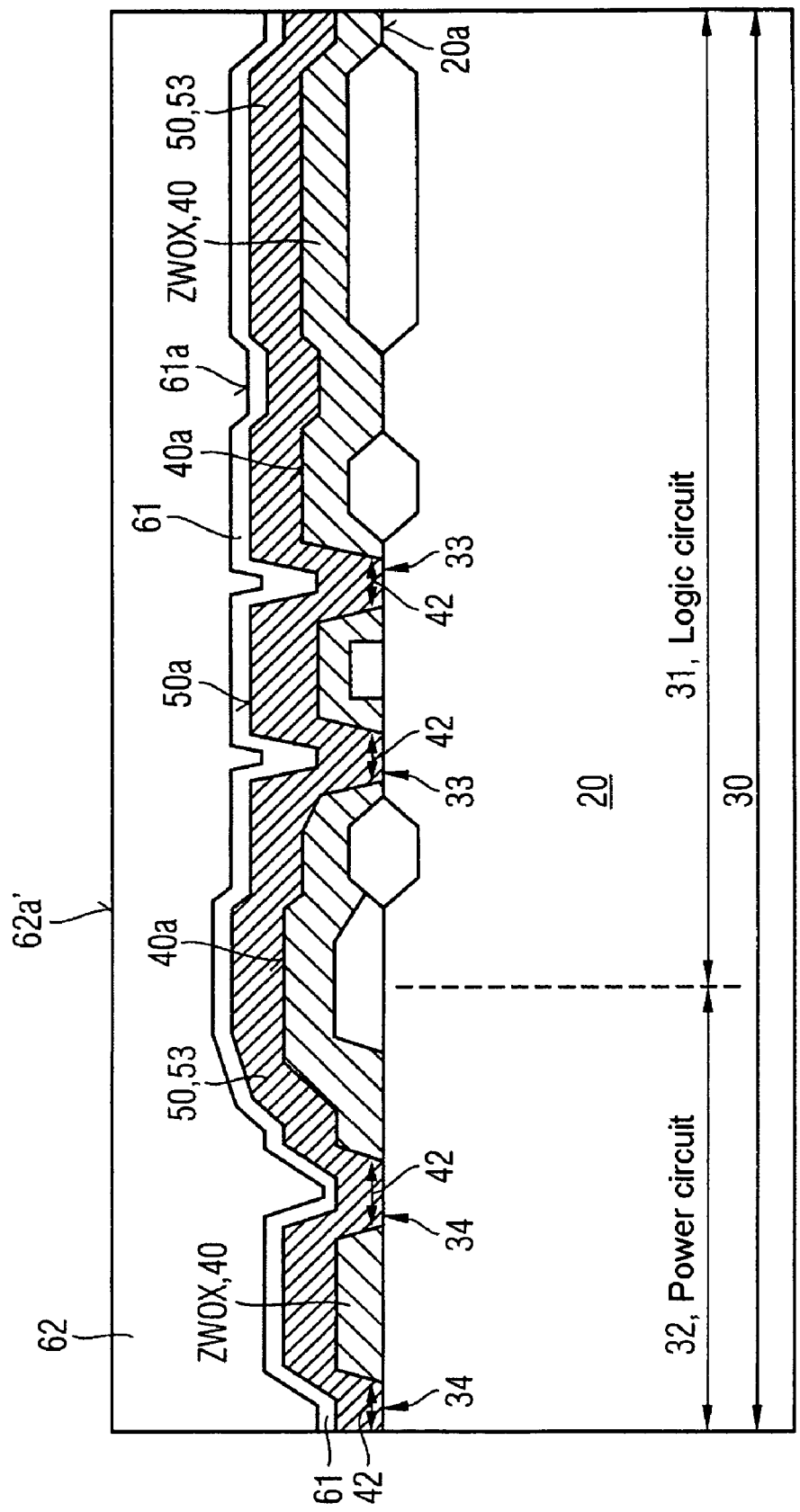

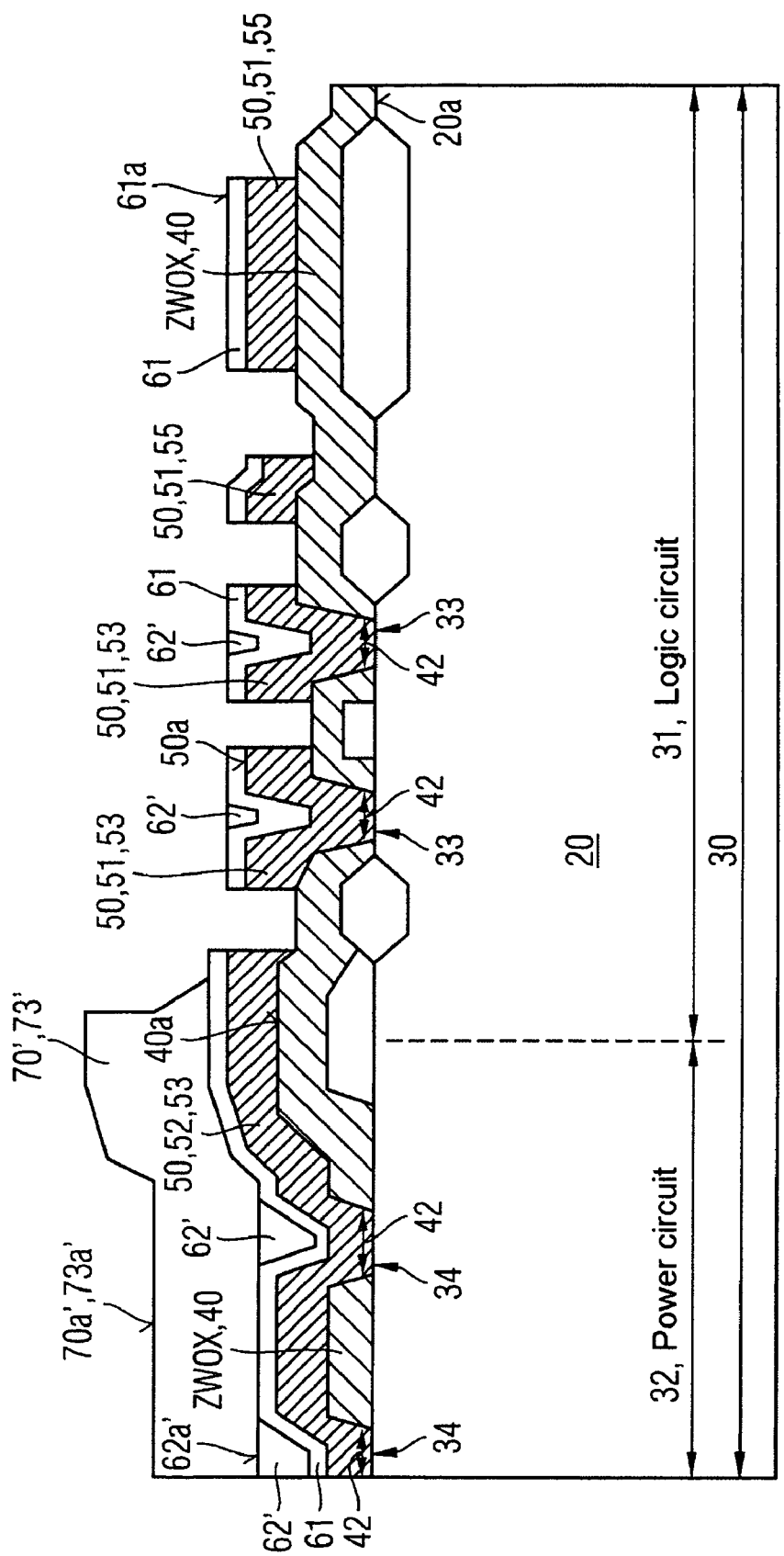

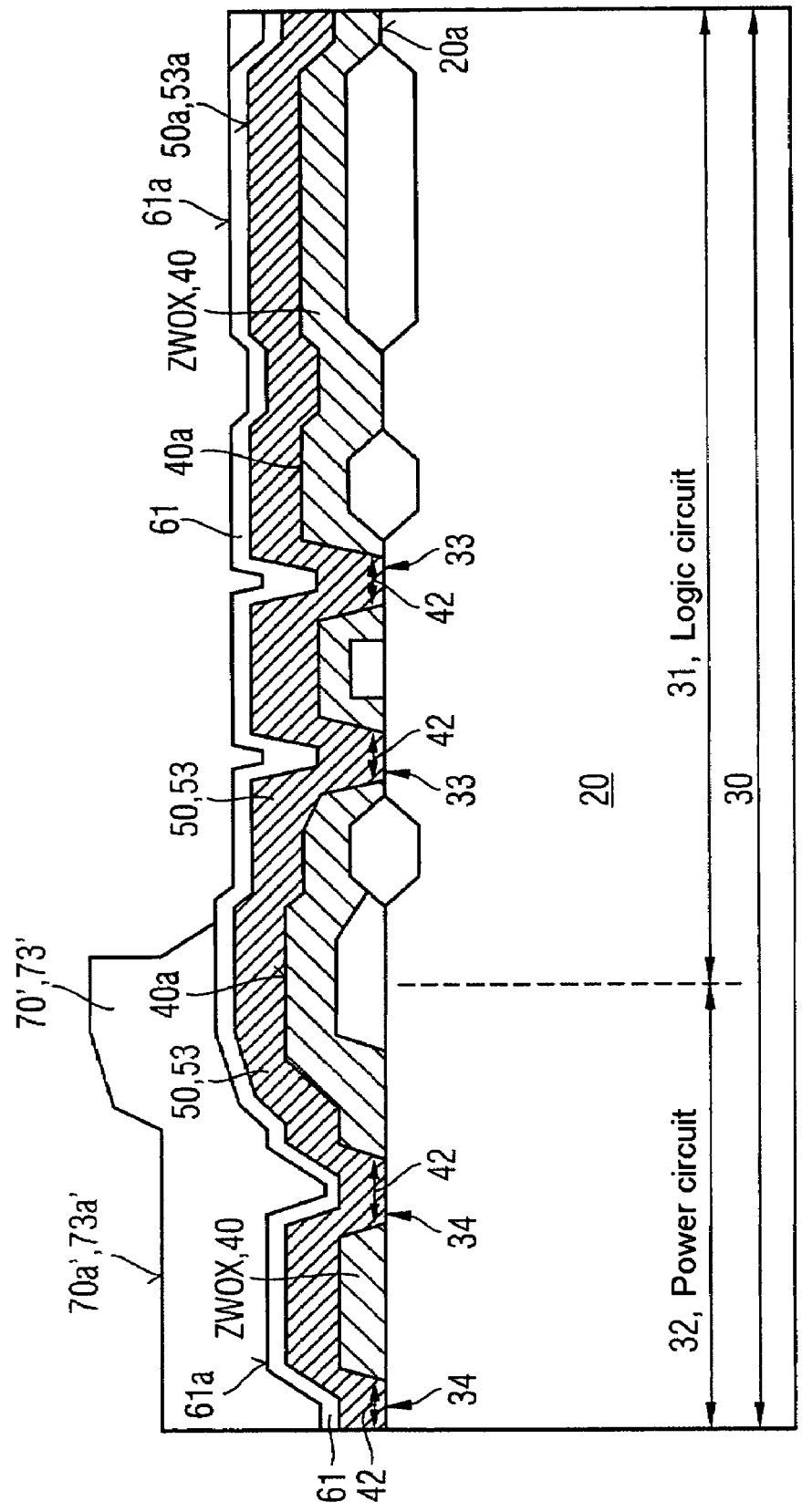

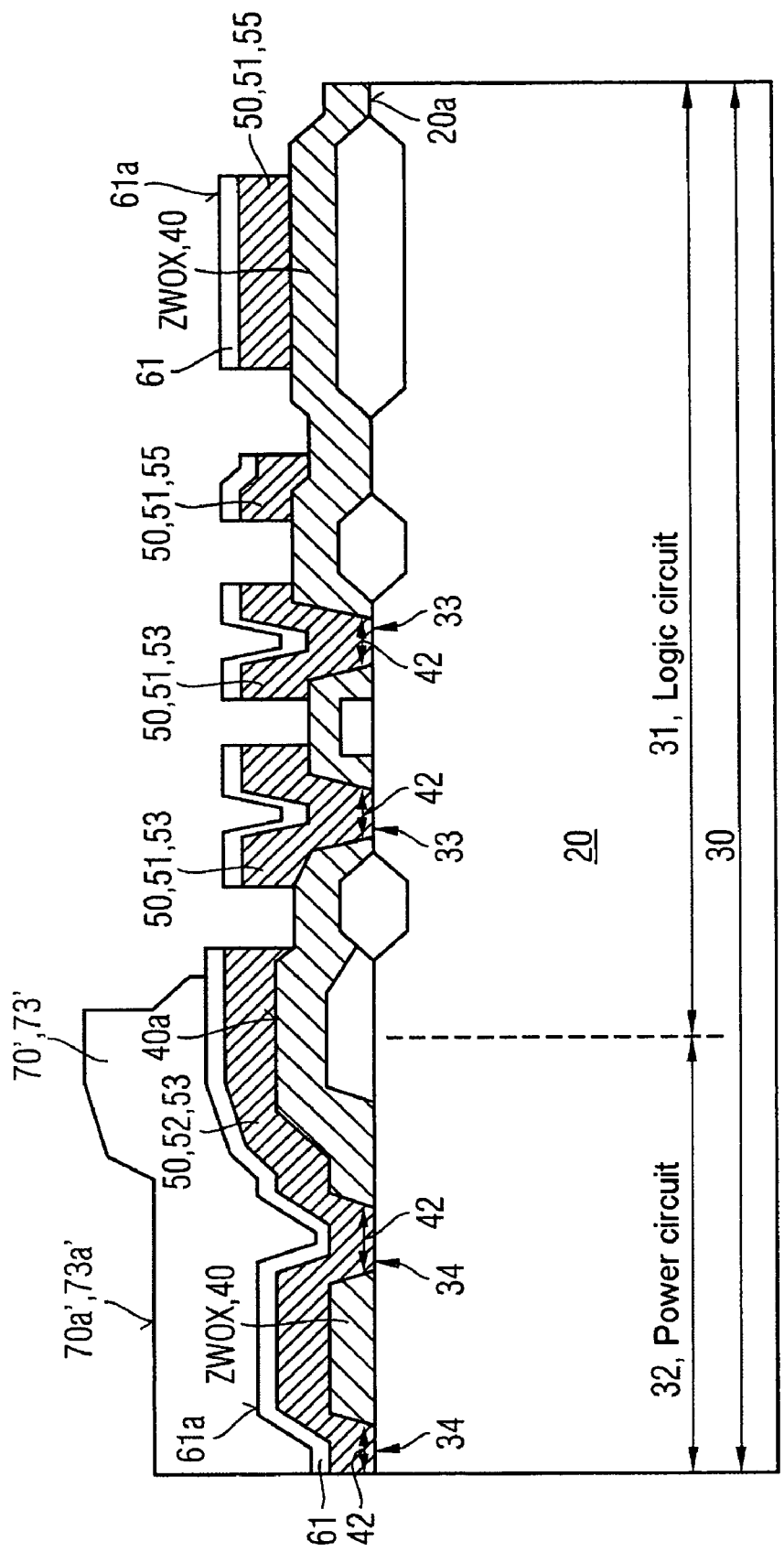

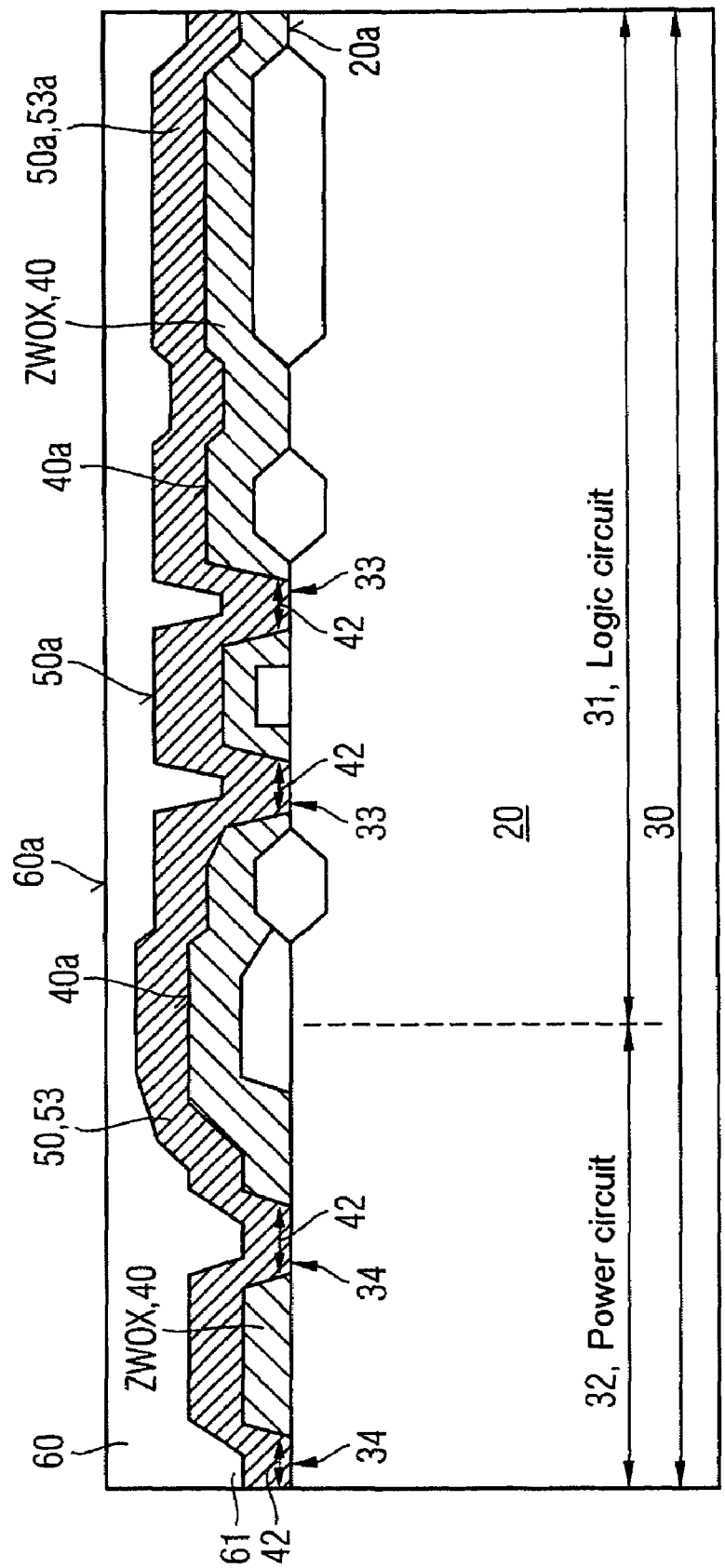

METHOD FOR FORMING AN INTEGRATED SEMICONDUCTOR CIRCUIT ARRANGEMENT

CROSS-REFERENCE TO RELATED APPLICATIONS

This Utility patent application claims priority to German Patent Application No. DE 10 2004 026 232.2, filed on May 28, 2004, which is incorporated herein by reference.

FIELD OF THE INVENTION

The invention relates to a method for forming an integrated semiconductor circuit arrangement.

BACKGROUND

In many integrated semiconductor circuit arrangements, different semiconductor circuit regions are formed in the region of a semiconductor material. These different semiconductor circuit regions provide different functions during operation of the integrated semiconductor circuit arrangement. Therefore, these semiconductor circuit regions are generally also constructed and patterned differently. These different structures also have to be taken into consideration in the context of the respective fabrication process.

It is thus provided, by way of example, that the different semiconductor circuit regions of the integrated semiconductor circuit arrangement are formed with different contacts with regard to their contact-connection among one another or else externally. These contacts may differ for example with regard to the layer thickness of the materials used for the contacts, in particular of the metallizations used.

Since, by way of example, control circuit arrangements or logic circuits have a relatively low power consumption, for the formation of contacts in circuit arrangements of this type a comparatively small layer thickness suffices for the metallization layer provided and is expedient with regard to miniaturization and high packing density in this circuit region.

In addition to the contacts, the wiring interconnects represent essential elements of a logic metallization. In particular, the width and the spacing of the interconnects are among the crucial factors for the packing density that can be achieved.

On the other hand, specific other circuit regions may exhibit a comparatively quite high electrical power consumption which is correspondingly also imparted by contacts that are to be dimensioned more generously and metallization layers made correspondingly thicker. When forming the metallizations necessary for ensuring the respective layer thicknesses and functionalities, the functionality of the respectively underlying structures must remain unimpaired. However, this cannot always be ensured to a sufficient extent in the case of conventional patterning methods and in particular in the case of the respective process steps for forming different metal layer thicknesses.

SUMMARY

Embodiments of the invention provide methods for forming an integrated semiconductor circuit arrangement. In one embodiment, a semiconductor circuit with a first semiconductor circuit region and with a second semiconductor circuit region is formed in each case in a semiconductor material region. A first metallization layer is applied to the structure thus obtained. A protective material region is then formed. A second metallization layer is subsequently applied, which is then also patterned. Afterward, the first metallization layer together with the protective material region is then patterned.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 describes one embodiment of the method according to the invention by means of a flowchart.

FIGS. 1a-h are schematic and sectional side views illustrating intermediate stages that are reached in another preferred embodiment of the method according to the invention for forming an integrated semiconductor circuit arrangement.

FIGS. 2a-h are schematic and sectional side views illustrating intermediate stages that are reached in a further preferred embodiment of the method according to the invention for forming an integrated semiconductor circuit arrangement.

FIGS. 3a-d are schematic and sectional side views illustrating intermediate stages that are reached in another advantageous embodiment of the method according to the invention for forming an integrated semiconductor circuit arrangement.

FIG. 4 is a schematic and sectional side view of another embodiment of an integrated semiconductor circuit arrangement.

DETAILED DESCRIPTION

Figure 1D:
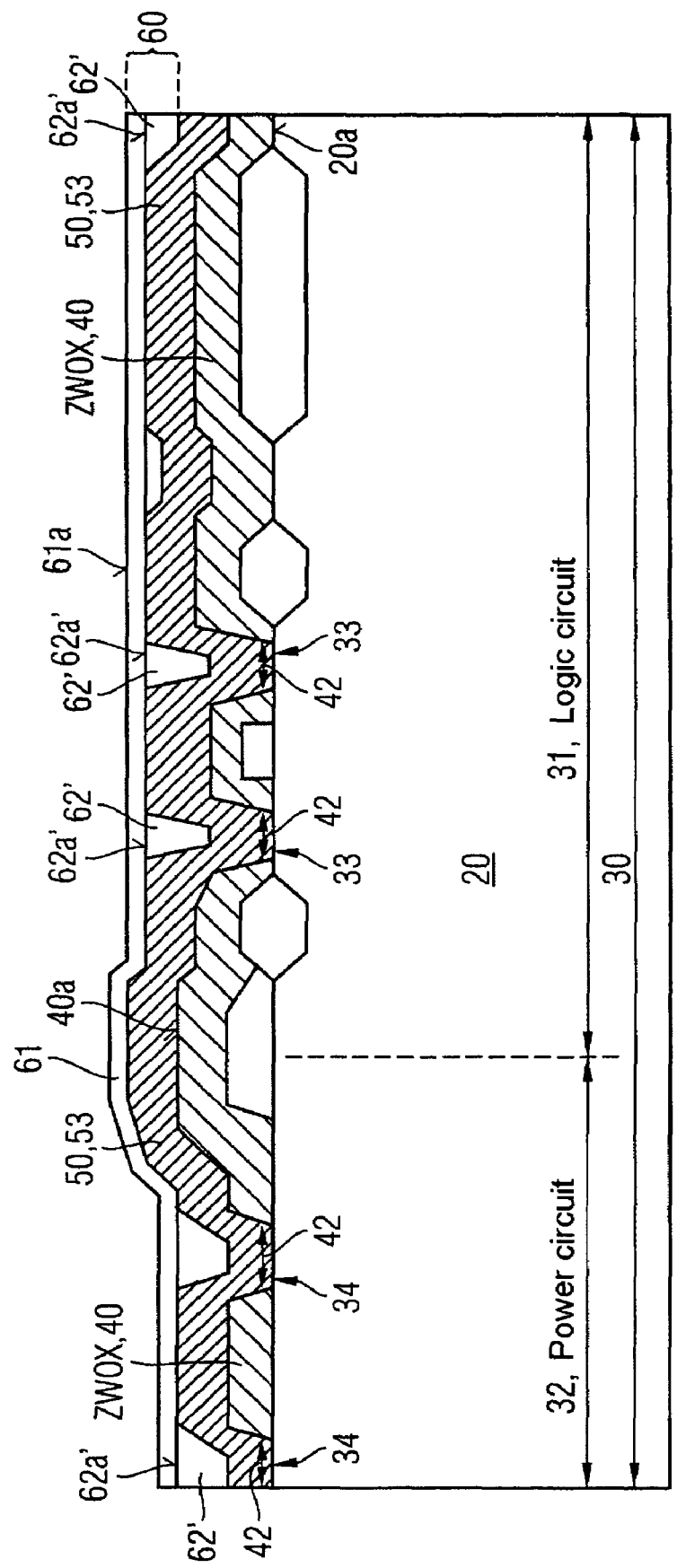

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The object on which the invention is based is to demonstrate a possibility that enables sensors of this type to be integrated into a trench transistor as effectively as possible.

In order to achieve the object the invention provides a trench transistor in accordance with patent claim 1. Advantageous refinements and developments of the concept of the invention are found in the subclaims.

The trench transistor according to the invention has a cell array, in which a plurality of cell array trenches and a plurality of mesa zones arranged between the cell array trenches are provided. Furthermore, the trench transistor has a semiconductor functional element serving as a sensor, which is formed in one of the mesa zones. The trench transistor is configured such that it is possible to generate, in the operating state of said trench transistor, vertically oriented current flows that permeate (at least some of the) mesa zones, and horizontally oriented current flows that permeate the semiconductor functional element. A current flow guiding structure is provided in the mesa zone in which the semiconductor functional element is formed, said structure being formed at least partly below the semiconductor functional element and being configured such that vertically oriented current flows out of the semiconductor functional element or into the semiconductor functional element are made more difficult and horizontally oriented current flows through the semiconductor functional element are promoted.

The current flow guiding structure makes it possible to suppress parasitic current flows between the semiconductor functional element and a drain terminal zone of the trench transistor. In this way, the horizontally oriented current flows that permeate the semiconductor functional element and that represent a measure of the parameter to be measured, for example the temperature, can be determined in an uncorrupted manner whereby the accuracy of the parameter measurement can be improved.

The semiconductor functional element is preferably a transistor, but may also be any other semiconductor functional element, for example a diode or a resistor.

In one preferred embodiment, the semiconductor functional element is a MOS-transistor having a source zone of a first doping type, a body zone of a second doping type and a drain zone of the first doping type. The source zone and the drain zone are spaced apart horizontally from one another and connected to one another by the body zone. In this embodiment, at least one of the electrodes that are provided within the cell array trenches adjacent to the semiconductor functional element serves as a gate electrode in order to induce a channel in the body zone of the MOS transistor.

In a further preferred embodiment, the semiconductor functional element is realized as a bipolar transistor having an emitter zone of a first doping type, a base zone of a second doping type and a collector zone of the first doping type. The emitter zone is horizontally spaced apart from the collector zone; furthermore, the emitter zone and the collector zone are connected to one another by the base zone.

The current flow guiding structure may be a highly doped semiconductor layer, by way of example. If the semiconductor functional element is formed as a transistor, the second doping type would have to be chosen as the doping type of the semiconductor layer. Furthermore, the semiconductor layer should directly adjoin the body zone/base zone. However, it is also possible to bury the semiconductor layer in a manner spaced apart from the body zone/base zone within the mesa zone.

The current flow guiding structure should preferably cover the entire cross-sectional area of the mesa zone below the semiconductor functional element in order to enable parasitic current flows to be suppressed as well as possible. However, the invention is not restricted thereto; by way of example, semiconductor layers with cutouts are also conceivable.

The semiconductor functional element may be arranged at an arbitrary location within the cell array. By way of example, it is possible to arrange the semiconductor functional element between two active cell array trenches. As an alternative thereto, it is possible to arrange the semiconductor functional element between deactivated cell array trenches at the edge of the cell array. The positioning of the semiconductor functional element within the trench transistor depends greatly on what parameter is intended to be measured. Thus, the semiconductor functional element would advantageously have to be positioned centrally in the cell array if the temperature of the cell array is intended to be measured as accurately as possible.

The semiconductor functional element may be completely enclosed with trenches. By way of example, the semiconductor functional element may be laterally delimited by the cell array trenches, the cell array trenches in front of and behind the semiconductor functional element being connected to one another by additional transverse trenches, thus giving rise to a closed trench ring around the semiconductor functional element.

The invention can particularly advantageously be applied to dense trench transistors, that is to say to trench transistors whose trenches are very close to one another (i.e., whose mesa zone widths are small). In one preferred embodiment, the semiconductor functional element serves as a temperature sensor for measuring the temperature of the cell array. Further application possibilities would be current intensity sensors, voltage sensors and the like.

Structurally and/or functionally similar or equivalent elements and structures are designated by the same reference symbols hereinafter. A corresponding detailed description is not repeated each time these reference symbols occur.

FIG. 1 is a schematic flowchart demonstrating the sequence of individual method steps of an embodiment of the methods according to the invention for forming an integrated semiconductor circuit arrangement.

A first step S1, A involves firstly forming or providing a semiconductor material region 20 or a fundamental semiconductor structure with a first semiconductor circuit region 31 and a second semiconductor circuit region 32. Afterward, a first metallization layer 50 is then formed on the given structure in a second step S2, B. A third step S3, C, which is critical for the invention, then involves forming a protective material region 60 with one or with a plurality of electrically conductive materials. A process section D then follows, in which a second material layer is formed in a first substep S4a and is then patterned in a second substep S4b, a second metal material being used. During the patterning of the second metallization layer 70, care must be taken to ensure that the protective material region 60 is not patterned concomitantly. The patterning of the protective material region 60 is effected simultaneously with the patterning of the first metallization layer 50 in a subsequent fifth step S5, E.

The sequence of FIGS. 1a to 1h elucidates in greater detail a first preferred embodiment of the method according to the invention for forming an integrated semiconductor circuit arrangement. In this method, it is critical that firstly a planarizing first layer 62 and then the actual protective layer 61 are applied during the formation of the protective material region 60.

FIG. 1a illustrates a sectional side view of a structure such as is obtained as an intermediate stage during the method according to the invention for forming an integrated semiconductor circuit arrangement in accordance with this embodiment. A first semiconductor circuit region 31, here for example a logic circuit, and a second semiconductor circuit region 32, here for example a power circuit, are formed and provided in a semiconductor material region 20. First and second contact locations 33 and 34 of the first semiconductor circuit region 31 and of the second semiconductor region 32, respectively, are formed in the region of the surface 20a or in the surface region 20a of the semiconductor material region 20, and are formed and provided for external contact-connection or for connection to one another via interconnects. This structure is adjoined by an intermediate oxide layer 40, ZWOX that covers and/or partly embeds it, the first and second contact locations 33 and 34, respectively, remaining free of the intermediate oxide 40, ZWOX. A first metallization layer 50 made of a first metal material 53 is then formed onto this structure, in particular in an essentially conformal manner. In this case, the contact structures 42 or cutouts 42 above the first and second contact locations 33, 34, respectively, are filled. These contact structures, cutouts or depressions 42 are indicated as lateral double arrows in FIG. 1a above the first and second contact locations 33 and 34, respectively.

In the transition to the intermediate stage illustrated in FIG. 1b, firstly a planarization layer 62 with a planar surface region 62a is then formed in order to produce the protective material region 60 that is to be provided in accordance with the invention, as a result of which the surface topography of the structure from FIG. 1a and in particular the depressions and/or cutouts formed there above the first and second contact locations 33 and 34, respectively, are filled with the material of the planarization layer 62.

In the transition to the intermediate state shown in FIG. 1c, the planarization layer 62 is then thinned, giving rise to a planarization layer 62' of reduced layer thickness with a pulled-back surface 62a', but the contact structures, cutouts or depressions 42, in particular above the first and second contact locations 33 and 34, remain filled in the process. In this way, the structure shown in FIG. 1c exhibits a surface topography that is planarized with respect to the preceding structures.

In the transition to the intermediate state shown in FIG. 1d, a protective material layer 61 with an at least partly planar surface region 61a is then deposited conformally on the structure from FIG. 1c.

Figure 1E:
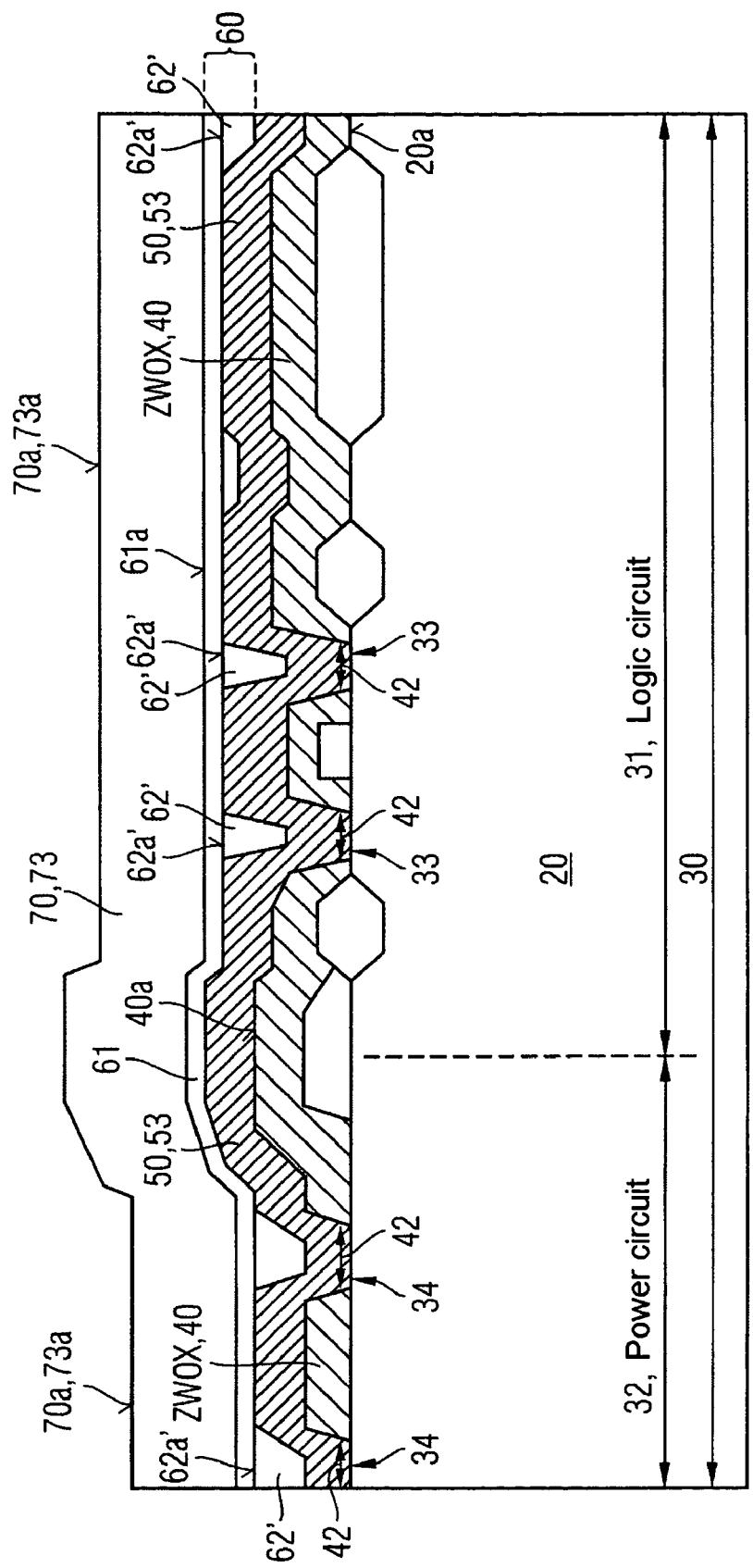

In the transition to the intermediate state shown in FIG. 1e, a second metallization layer 70 with a second metallization material 73 is then formed on the surface 61a of the structure from FIG. 1d.

The second metallization layer 70 with the second metal material 73 has a surface region 70a, 73a that is formed likewise partly or locally in planar fashion.

In the transition to the intermediate state of FIG. 1f, the structure from FIG. 1e is patterned in such a way that the second semiconductor circuit region 32 illustrated on the left-hand side in FIG. 1f, namely the power circuit here, remains covered, while the first semiconductor circuit region 31 illustrated on the right-hand side of the illustration in FIG. 1f, namely the logic circuit here, is essentially freed of the second metallization layer 70 or the second metal material 73.

What is not illustrated here is that so-called logic bonding pads that may serve for the external contact-connection may remain covered by the second metal material 73. All that is important is that, in the region of the first semiconductor circuit region 31, that is to say the logic circuit, the corresponding contact structures 42 above the contact locations 33 of the first semiconductor circuit region 31 are not reinforced by the second metallization layer 70 and the second metal material 73.

In the transition to the intermediate state shown in FIG. 1g, the first metallization layer 50 comprising the first metal material 53 is then patterned, thus giving rise to first contacts 51 and also wiring interconnects 55 formed from said first metal material 53 in the region of the first semiconductor circuit region 31, that is to say the logic circuit, as is illustrated in FIG. 1g. At the same time as the patterning of the first metallization layer 50 in the region of the first semiconductor circuit region 31, the protective material layer 61 is also concomitantly patterned in such a way that the regions of the first contacts 51 remain covered by it.

During the patterning of the first metallization layer 50 in the region of the first semiconductor circuit region 31, the first metal material 53 in the region of the second semiconductor circuit region 32 remains untouched, that is to say that it is not concomitantly patterned.

Figure 1H:
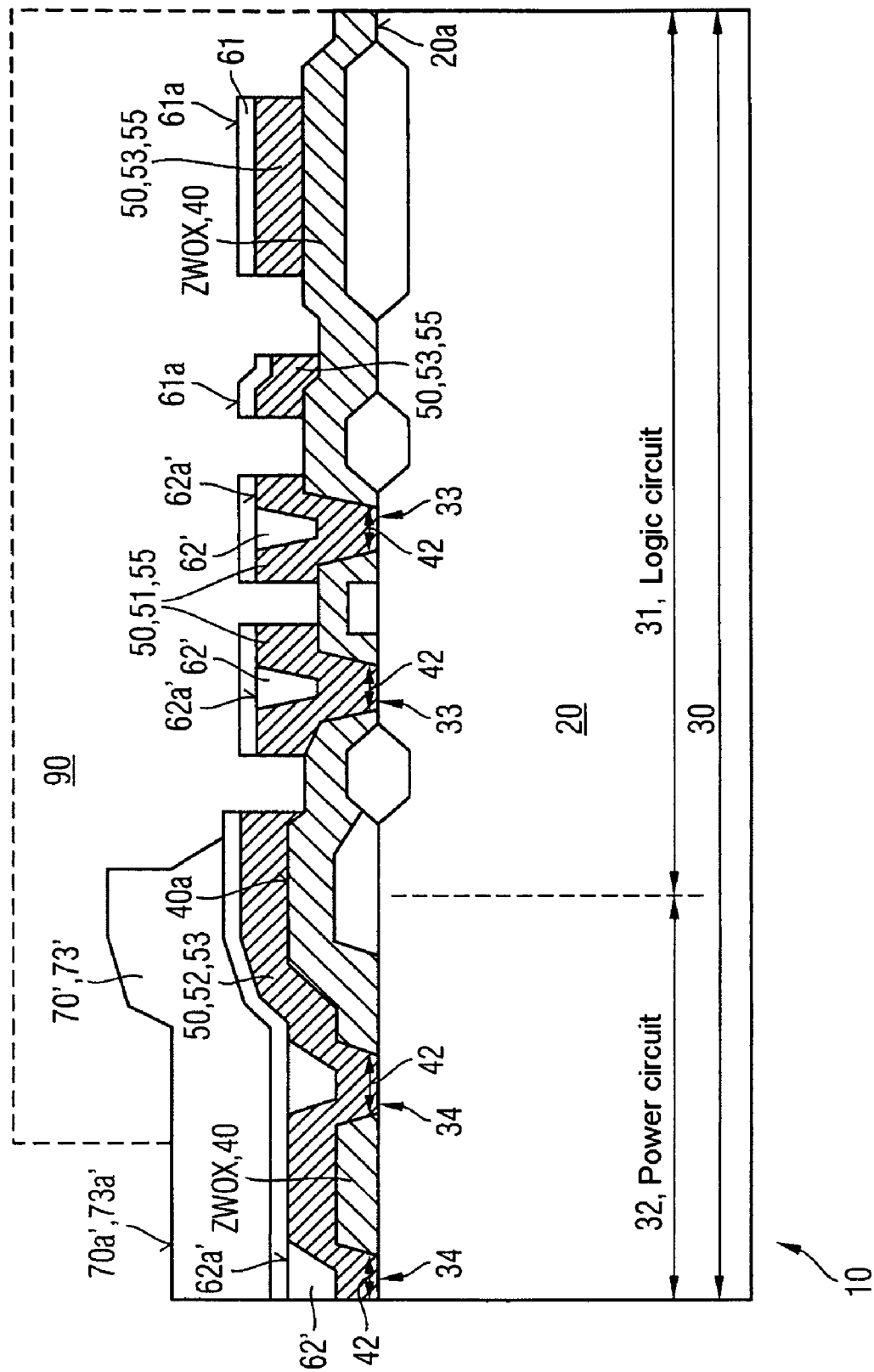

In the transition to the intermediate state illustrated in FIG. 1h, the structure from FIG. 1g is then embedded in a passivation layer and/or in an imide layer 90 in the region of the first semiconductor circuit region 31 and partly also in the region of the second semiconductor circuit region 32. It is also conceivable for the second semiconductor circuit region 32 to be completely embedded.

What is critical in the case of the embodiment illustrated by FIGS. 1a to 1h is that the protective material region 60 is formed by firstly applying a planarization layer 62 and then covering it by a protective material layer 61.

By contrast, the embodiment of the method according to the invention in accordance with the sequence of FIGS. 2a to 2h shows the opposite procedure, with the result that, in the embodiment described by FIGS. 2a to 2h, the protective material region 60 is formed by firstly applying the protective material layer 61 on the fundamental structure and then applying the planarization layer 60.

Figure 2A:
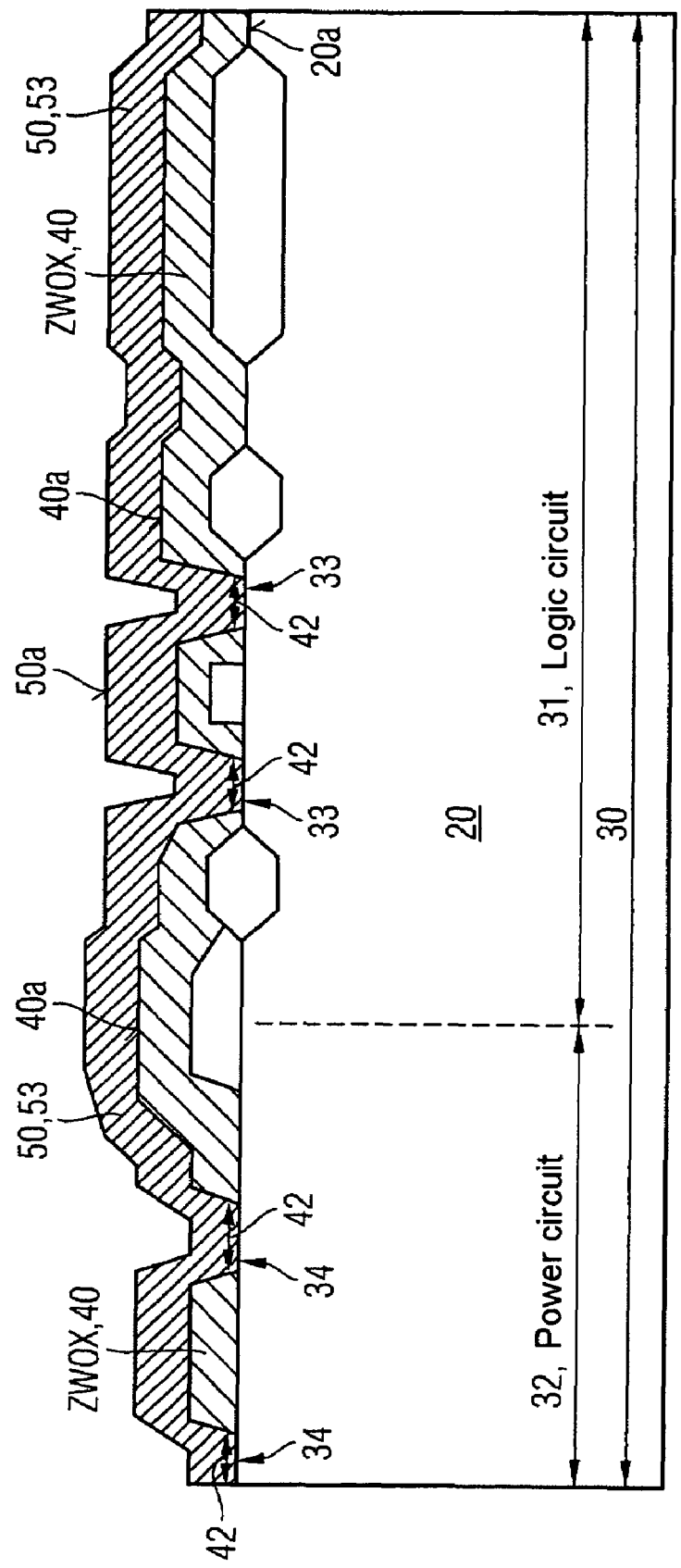
Figure 2B:
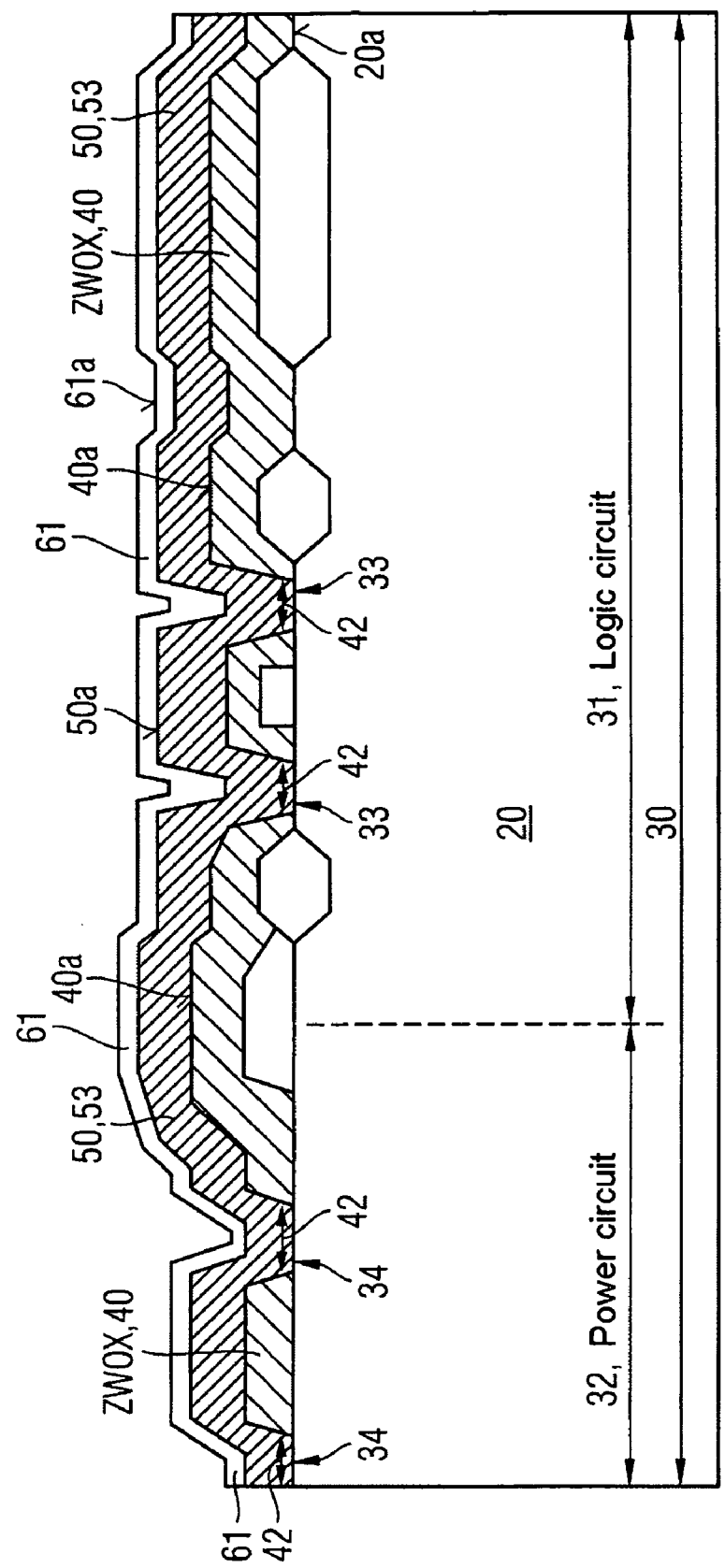

Proceeding from the structure which is shown in FIG. 2a and corresponds to the structure shown in FIG. 1a of the exemplary embodiment described above, in the transition to the intermediate state shown in FIG. 2b, firstly the protective material layer 61 of the protective material region 60 is formed ideally in conformal fashion.

Figure 2D:
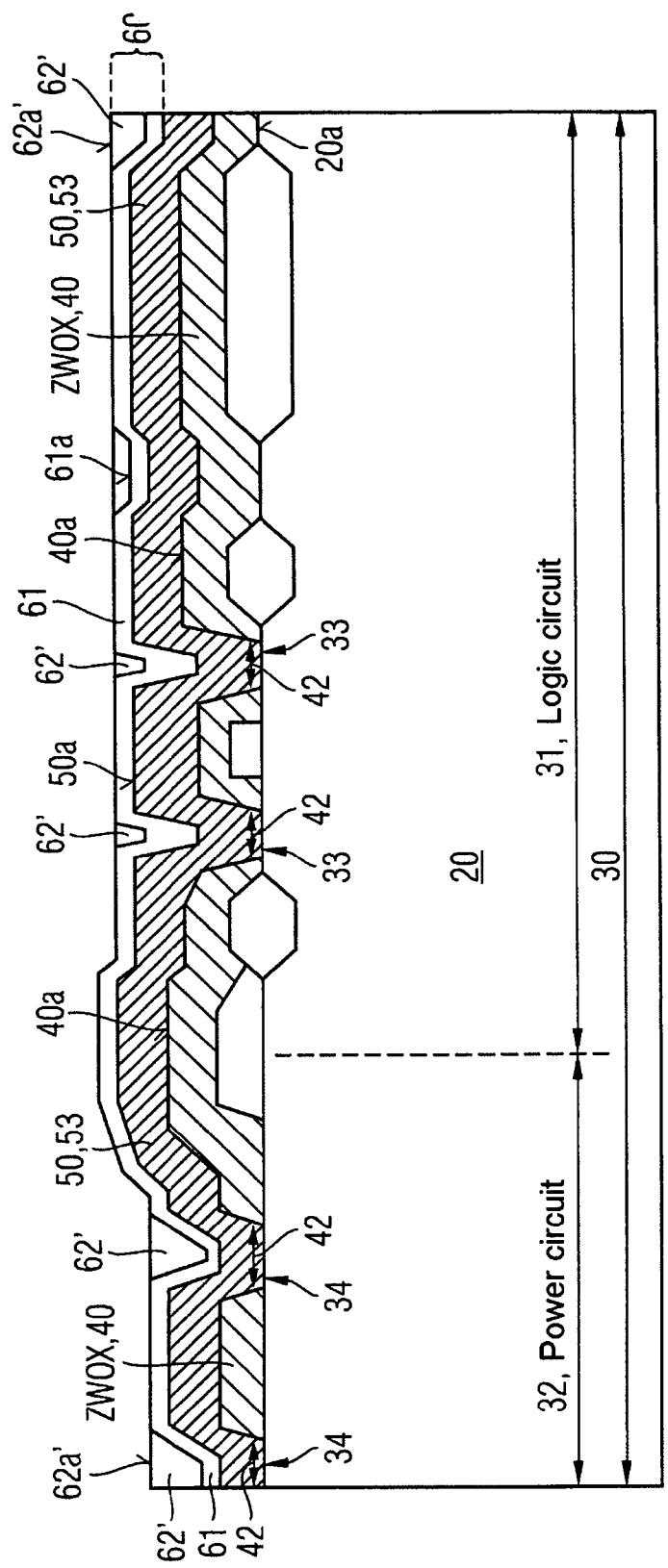

In the transition to the intermediate state shown in FIG. 2c, firstly the planarization material layer 62 is then formed, so that cutouts and depressions 42, in particular above the first and second contact locations 33 and 34, are filled, and then, in the transition to the intermediate stage shown in FIG. 2d, said layer is converted by etching-back into a reduced planarization material layer 62' with the surface 62a' having been brought back, but the cutouts and depressions 42 of the previously obtained structure remain filled, thus resulting in a planarized or smoothed surface topography in the structure from FIG. 2d.

Figure 2E:
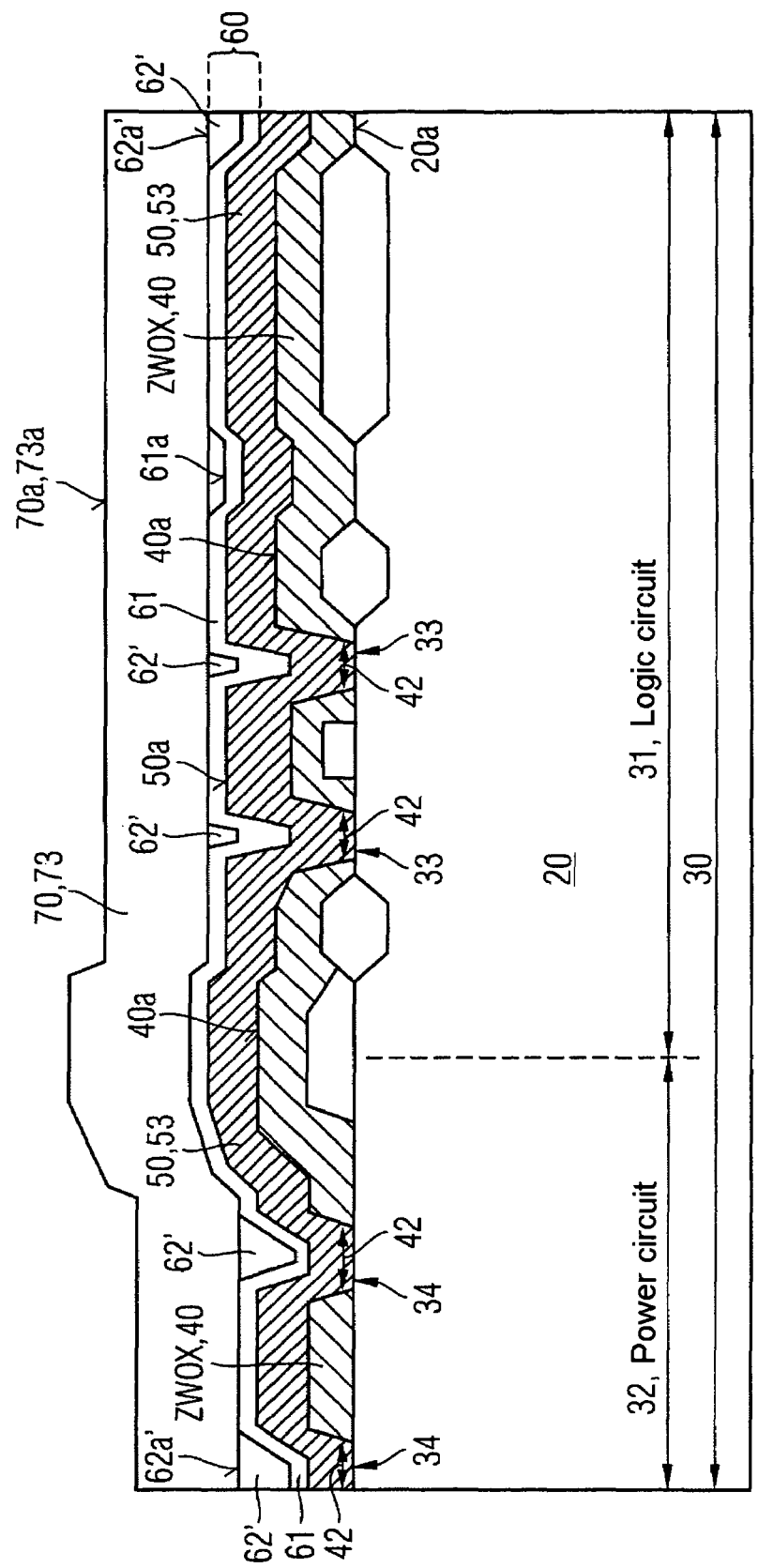
Figure 2F:
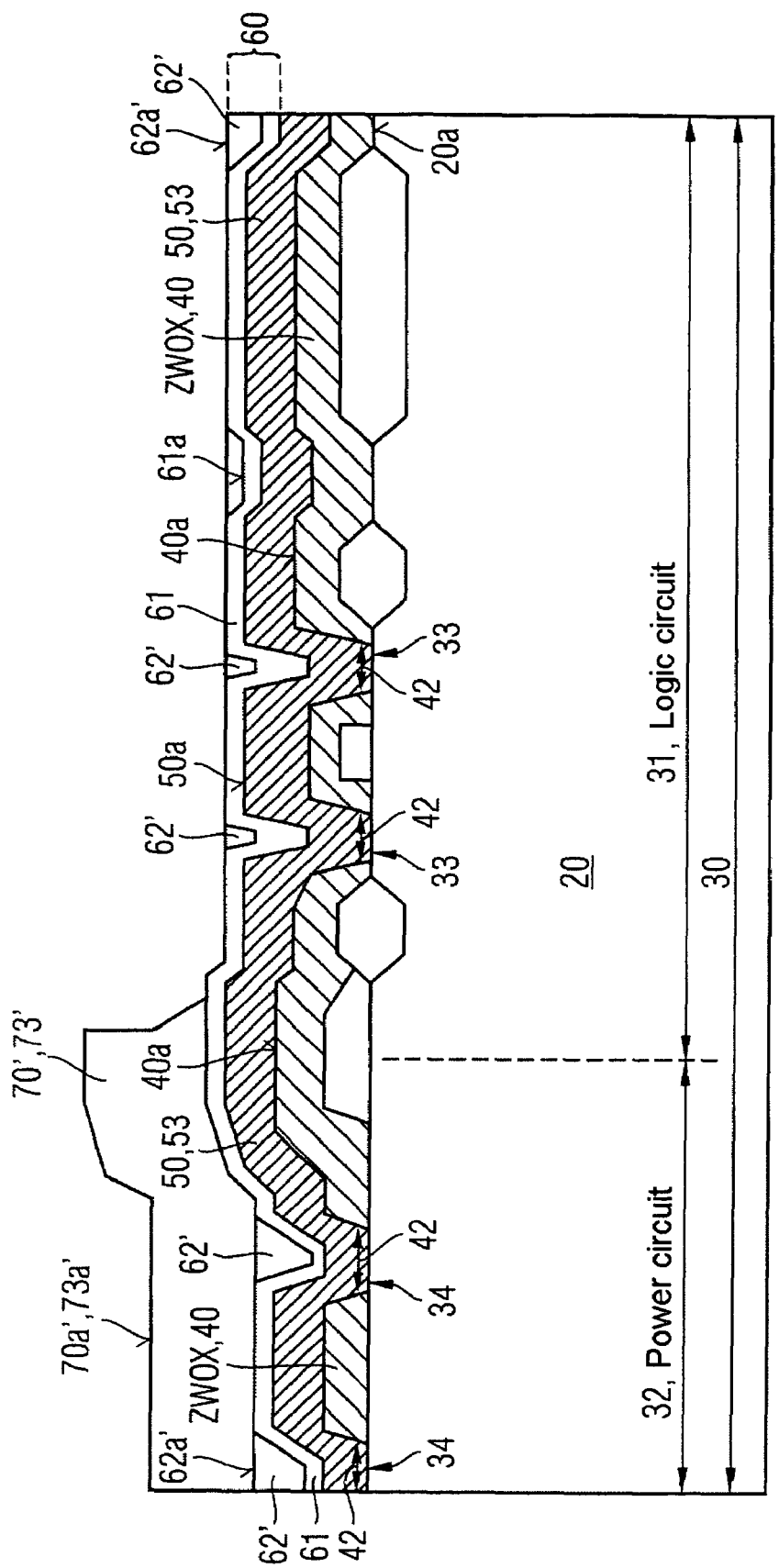
Figure 2H:
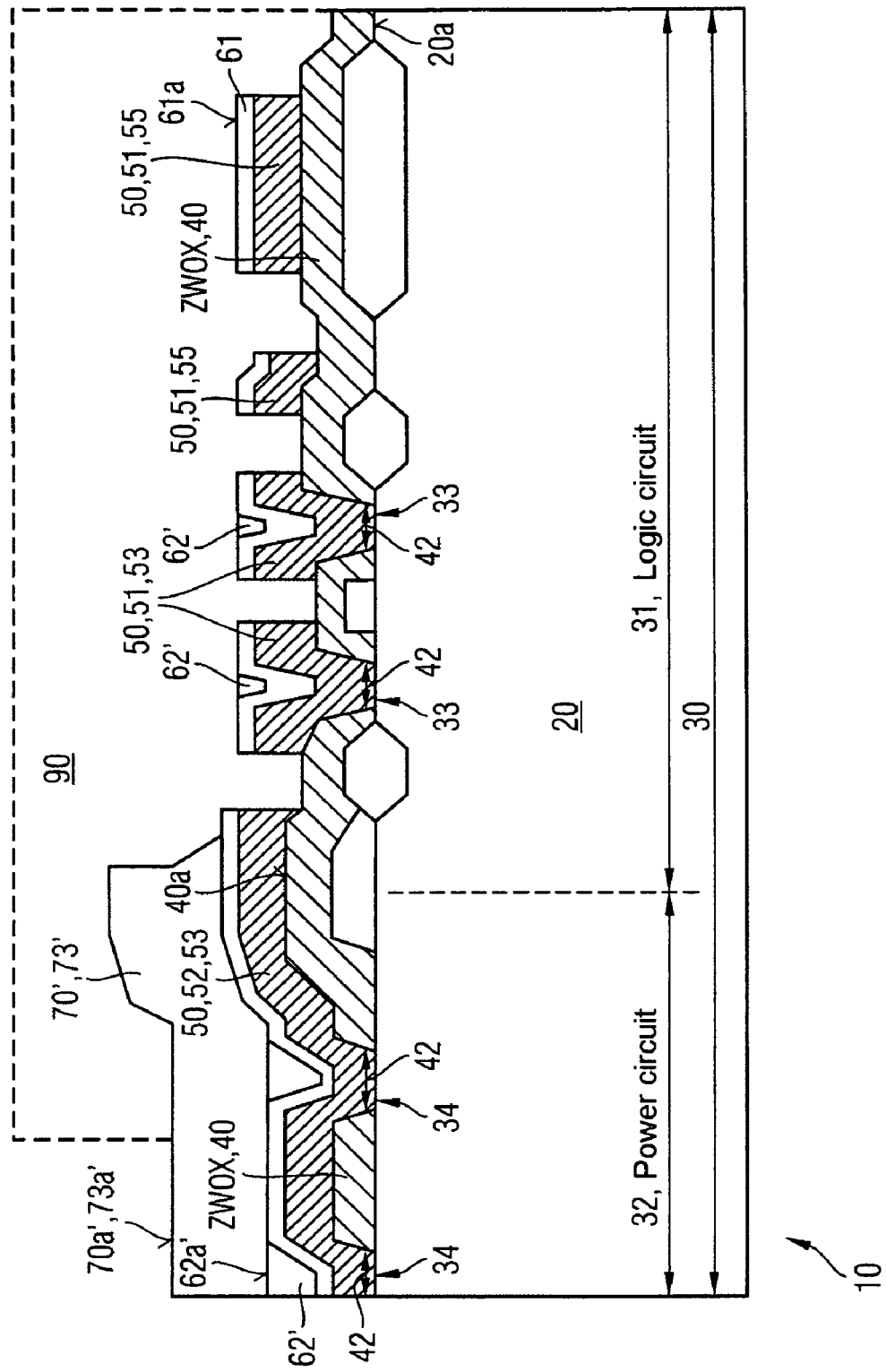

The procedure then once again effects, in a manner analogous to the embodiment described above, the application and patterning of the second metallization layer 70, as is shown in FIGS. 2e and 2f, with a subsequent patterning of the first metallization layer 50 and the corresponding passivation, as is shown in FIGS. 2g and 2h. The sequence of the processes of FIGS. 2e to 2h thus corresponds approximately to the sequence of the processes of FIGS. 1e to 1h of the embodiment described above.

The sequence of FIGS. 3a to 3d shows that a planarization is not absolutely necessary in accordance with the present invention. In the case of the structure illustrated in FIG. 3a, a protective material layer 61 of the protective material region 60 has been applied directly to the continuous first metallization layer 50 made of the first metal material 53.

Instead of a planarization layer 62 then to be applied, the second metallization layer 70 made of the second metal material 73 is then formed directly and is then patterned, in the transition to the intermediate stage from FIG. 3b, in such a way that a reinforcement of the metallization layers results above the second contact locations 34 of the second semiconductor circuit region 32, that is to say in the region of the power circuit, and the first semiconductor circuit 31 is freed of the second metallization layer 70 in its surface region.

In the transition to the intermediate stage shown in FIG. 3c, the first metallization layer 50 is then patterned, to be precise once again together with the protective material layer 61 provided thereon, so that the first contacts 51 arising in this case remain covered by the protective material layer 61; this also holds true for the correspondingly arising wiring interconnects 55.

Figure 3A:
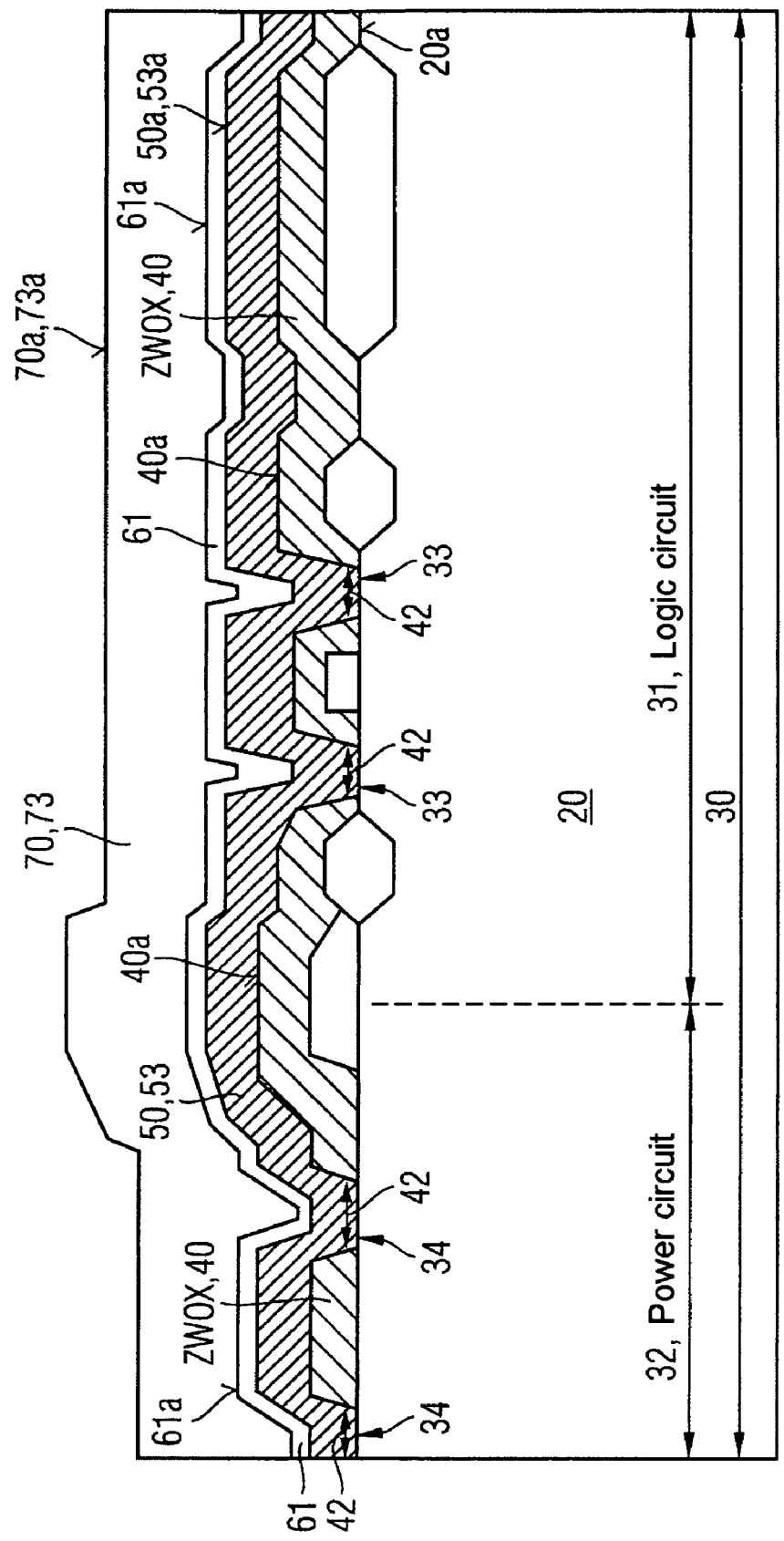
Figure 3D:
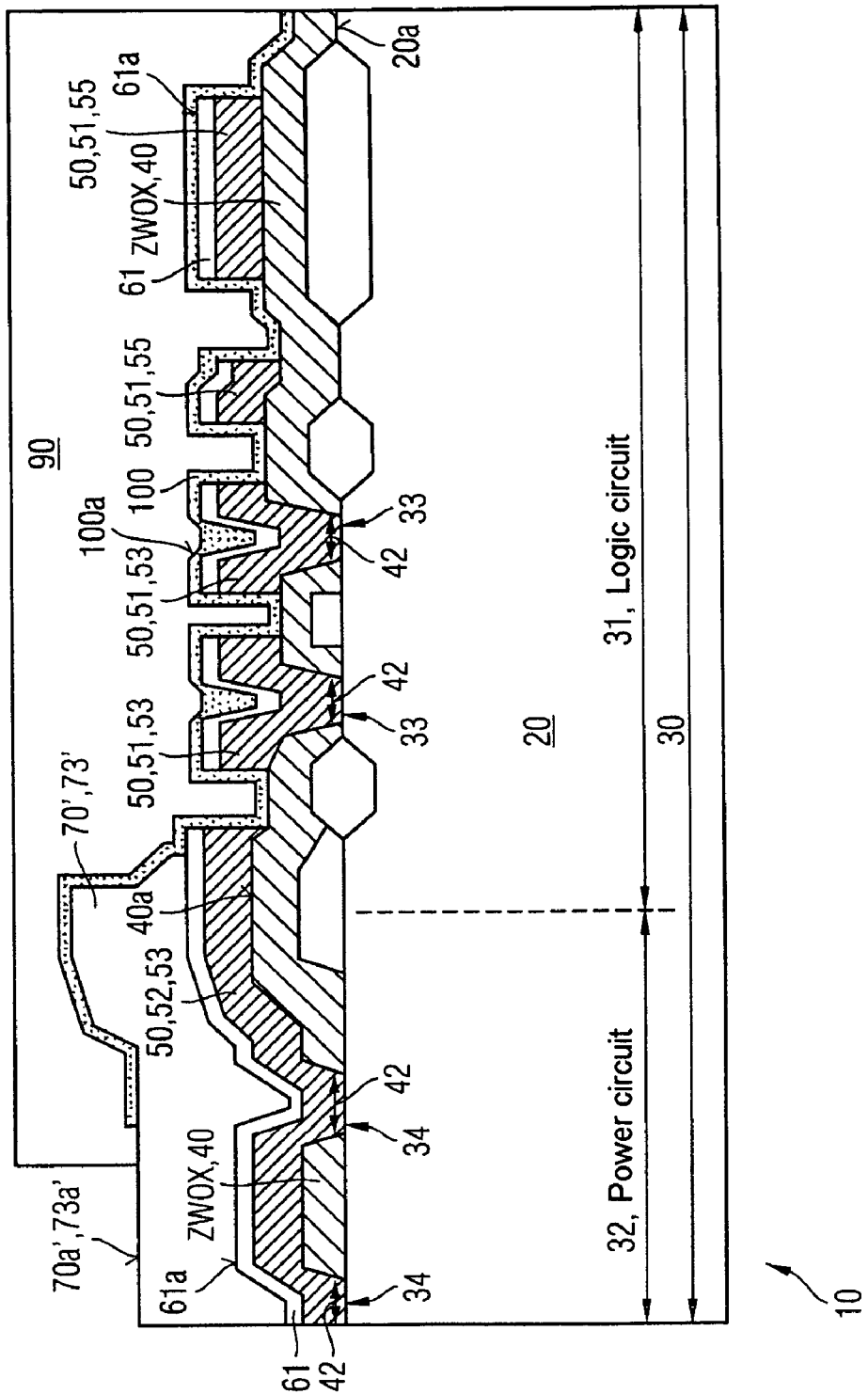

In the transition to the intermediate stage shown in FIG. 3d, firstly a passivation is then effected by conformal formation of a passivation layer 100 with a surface 100a, the first semiconductor circuit region 31, the transition to the second semiconductor circuit region 32 and also parts of the second semiconductor circuit region 32 being covered. Finally, embedding in an imide layer 90 is effected. It is also conceivable for the entire second semiconductor circuit region 32 to be embedded.

Furthermore, it is also conceivable to use a single combined conductive and planarizing protective layer 60 which does not have to be etched back, in accordance with FIG. 4.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming an integrated semiconductor circuit arrangement, comprising:

providing a semiconductor material region with a first semiconductor circuit region and with a second semiconductor circuit region, which are formed in the semiconductor material region and are covered with an intermediate oxide layer, contact structures or cutouts being formed in the intermediate oxide layer, which contact structures or cutouts reach as far as first contact locations of the first semiconductor circuit region and as far as second contact locations of the second semiconductor circuit region;

forming a first metallization layer of a first metal material in such a way that at least the contact structures or cutouts are filled, the first contact locations of the first semiconductor circuit region are connected to the first metallization layer with first contacts, the second contact locations of the second semiconductor circuit region are connected to the first metallization layer with second contacts and metallization regions for wiring interconnects are formed in the region of and above the first semiconductor circuit region;

forming a protective material region with or from one or more electrically conductive materials in such a way that the previously obtained structure, the first metallization layer and the first contacts are covered or embedded;

forming and patterning a second metallization layer of a second metal material in such a way that the previously obtained structure and the first metallization layer in the region of and above the second semiconductor circuit region and the second contacts thereof are covered or embedded with the second metallization layer with the protective material region in between in such a way that the second contacts of the second semiconductor circuit region are covered and thereby reinforced; and that the previously obtained structure and the first metallization layer in the region of and above the first semiconductor circuit region and the first contacts with the protective material region uppermost remain free or are removed of the second metallization layer;

the patterning of the second metallization layer being effected without a patterning of the protective material region;

during the patterning of the second metallization layer, the protective material region is used for protecting the underlying structure, for protecting the first metallization layer and for protecting the first and second contacts thereof;

after the patterning of the second metallization layer, patterning the first metallization layer of the first metal material and the protective material region in the region of and above the first semiconductor circuit region in such a way that, in the region of and above the first semiconductor circuit region, at least contact structures or cutouts are filled, first contact locations of the first semiconductor circuit region are connected to the first metallization layer with the first contacts and wiring interconnects are formed in the region of and above the first semiconductor circuit region;

forming a planarization layer of the protective material region in such a way that a surface topography of a structure previously obtained after the patterning of the first and second metallization layers is planarized by filling depressions or cutouts and the integrated semiconductor circuit arrangement is planarized after forming the protective material region.

2. A method for forming an integrated semiconductor circuit arrangement, comprising:

providing a semiconductor material region with a first semiconductor circuit region and with a second semiconductor circuit region, which are formed in the semiconductor material region and are covered with an intermediate oxide layer, contact structures or cutouts being formed in the intermediate oxide layer, which contact structures or cutouts reach as far as first contact locations of the first semiconductor circuit region and as far as second contact locations of the second semiconductor circuit region;

forming and patterning an interconnection layer from or with an interconnection material in such a way that at least the contact structures or cutouts are filled and the first contact locations of the first semiconductor circuit region and the second contact locations of the second semiconductor circuit region are formed and connected to the interconnection layer with interconnection elements;

forming a first metallization layer of a first metal material in such a way that at least the interconnection elements and also the first contact locations of the first semiconductor circuit region are connected by means of the interconnection elements to the first metallization layer with first contacts, the second contact locations of the second semiconductor circuit region are connected to the first metallization layer with second contacts and metallization regions for wiring interconnects are formed in the region of and above the first semiconductor circuit region;

forming a protective material region with or from one or more electrically conductive materials in such a way that the previously obtained structure, the first metallization layer and the first contacts are covered or embedded;

forming and patterning a second metallization layer of a second metal material in such a way that the previously obtained structure and the first metallization layer in the region of and above the second semiconductor circuit region and the second contacts thereof are covered or embedded with the second metallization layer with the protective material region in between in such a way that the second contacts of the second semiconductor circuit region are covered and thereby reinforced; and that the previously obtained structure and the first metallization layer in the region of and above the first semiconductor circuit region and the first contacts with the protective material region uppermost remain free or are removed of the second metallization layer;

the patterning of the second metallization layer being effected without a patterning of the protective material region;

during the patterning of the second metallization layer, the protective material region is used for protecting the underlying structure, for protecting the first metallization layer and for protecting the first and second contacts thereof;

after the patterning of the second metallization layer, patterning the first metallization layer of the first metal material and the protective material region in the region of and above the first semiconductor circuit region in such a way that, in the region of and above the first semiconductor circuit region, at least contact structures or cutouts are filled, first contact locations of the first semiconductor circuit region are connected to the first metallization layer with the first contacts and wiring interconnects are formed in the region of or above the first semiconductor circuit region;

forming a planarization layer of the protective material region in such a way that a surface topography of a structure previously obtained after the patterning of the first and second metallization layers is planarized by filling depressions or cutouts and the integrated semiconductor circuit arrangement is planarized after forming the protective material region.

3. The method of claim 2, comprising using tungsten or polysilicon as interconnection material of the interconnection layer.

4. The method of claim 2, comprising:

forming the protective material region from two or more successive material layers.

5. The method of claim 2, comprising:

forming the planarization layer of the protective material region with a first layer thickness in such a way that depressions or cutouts of a structure obtained are thereby filled; and reducing the planarization layer of the protective material region by etching back or thinning back from the first layer thickness to a reduced second layer thickness in the range of approximately 0.5 µm up to approximately 3 µm to a layer thickness such that the surface topography of the structure obtained is planarized by virtue of depressions or cutouts of the structure obtained remaining filled.

6. The method of claim 2 comprising forming the planarization layer of the protective material region with an electrically conductive material.

7. The method of claim 2, comprising forming the planarization layer of the protective material region with an electrically insulating material.

8. The method of claim 2, comprising forming the planarization layer of the protective material region with a material that is inert with respect to etching operations with regard to the second metallization layer.

9. The method of claim 2, comprising wherein outside filled cutouts or depressions, completely removing the planarization layer of the protective material region if the planarization layer of the protective material region is electrically insulating.

10. The method as claimed in claim 2, comprising forming an antireflection layer as an additional material layer on the protective material layer.

11. The method of claim 2, comprising forming the protective material layer as an antireflection layer.

12. The method of claim 2, comprising forming the first metallization layer with a layer thickness in the range of approximately 0.5 µm to approximately 3 µm.

13. The method of claim 2, comprising the first metallization layer and further comprising an antireflection layer wherein the first metallization layer and the antireflection layer are patterned plasma-chemically by means of a resist mask.

14. The method of claim 2, comprising forming wherein the second metallization layer with a layer thickness in the range of approximately 1 µm to approximately 30 µm.

15. The method of claim 2, comprising forming the first metallization layer and/or the second metallization layer using one of the processes sputtering, vapor deposition, electroplating and autogenous electroplating.

16. The method of claim 2, comprising using aluminum, copper, aluminum-copper or AlCu, AlCuSi, AlSiCu, tungsten, nickel, nickel-phosphorus or NiP, palladium, gold, molybdenum, silver, tin, doped polysilicon or mixtures or compounds thereof as the first metallization material and/or as the second metallization material.

17. The method of claim 2 wherein together with the second contacts of the second semiconductor circuit region, logic bonding pads for the external contact-connection of the first semiconductor circuit region are formed in the same way as the second contacts of the second semiconductor circuit region, but without contact to the semiconductor material region directly on the intermediate oxide.

18. The method of claim 2, comprising wherein an integrated semiconductor logic circuit is formed as the first semiconductor circuit region.

19. The method of claim 2, comprising wherein an integrated semiconductor power circuit is formed as the second semiconductor circuit region.

20. The method of claim 2, comprising wherein the protective material region is formed as a diffusion barrier layer that reduces the diffusion of silicon from the first metallization layer to the second metallization layer.

21. The method of claim 2, comprising wherein the protective material region is at least partially removed.

* * * * *